(12) United States Patent
Matsunobu

(10) Patent No.: US 8,331,503 B2
(45) Date of Patent: Dec. 11, 2012

(54) RECEIVING LEVEL CONTROL APPARATUS AND RECEIVER

(75) Inventor: Hidekazu Matsunobu, Fukuoka (JP)

(73) Assignee: Panasonic Corporation, Osaka (JP)

( * ) Notice: Subject to any disclaimer, the term of this patent is extended or adjusted under 35 U.S.C. 154(b) by 810 days.

(21) Appl. No.: 12/371,383

(22) Filed: Feb. 13, 2009

(65) Prior Publication Data
US 2009/0207953 A1    Aug. 20, 2009

(30) Foreign Application Priority Data

Feb. 15, 2008 (JP) ................................ 2008-034493

(51) Int. Cl.
*H04L 27/08* (2006.01)
(52) U.S. Cl. ........................ 375/345; 375/225; 455/402
(58) Field of Classification Search ................... 375/345, 375/225; 455/234.1, 402
See application file for complete search history.

(56) References Cited

U.S. PATENT DOCUMENTS

| | | | |
|---|---|---|---|
| 2003/0194029 A1* | 10/2003 | Heinonen et al. | 375/345 |
| 2005/0186928 A1* | 8/2005 | Miura | 455/234.1 |
| 2009/0154617 A1* | 6/2009 | Jung et al. | 375/345 |
| 2010/0128826 A1* | 5/2010 | Imamura et al. | 375/345 |

FOREIGN PATENT DOCUMENTS

| | | |
|---|---|---|
| JP | 2002-353813 | 12/2002 |
| JP | 2003-032057 | 1/2003 |

* cited by examiner

*Primary Examiner* — Eva Puente
(74) *Attorney, Agent, or Firm* — Dickinson Wright PLLC

(57) ABSTRACT

A receiving level control apparatus includes an amplifier to receive a signal and to amplify the signal based on a gain control signal, a memory to store an accumulated level of the amplified signal at every sampling period, and a gain control section to judge whether or not the accumulated level, which has been accumulated from a first time instant, exceeds a first reference value at a predetermined timing, and to control the gain control signal for the amplifier in response to a length of a time period defined from the first time instant up to a second time instant in a case that the accumulated level exceeds the first reference value, the second time instant defined as a time instant when the gain control section judges that the accumulated level exceeds the first reference value.

8 Claims, 13 Drawing Sheets

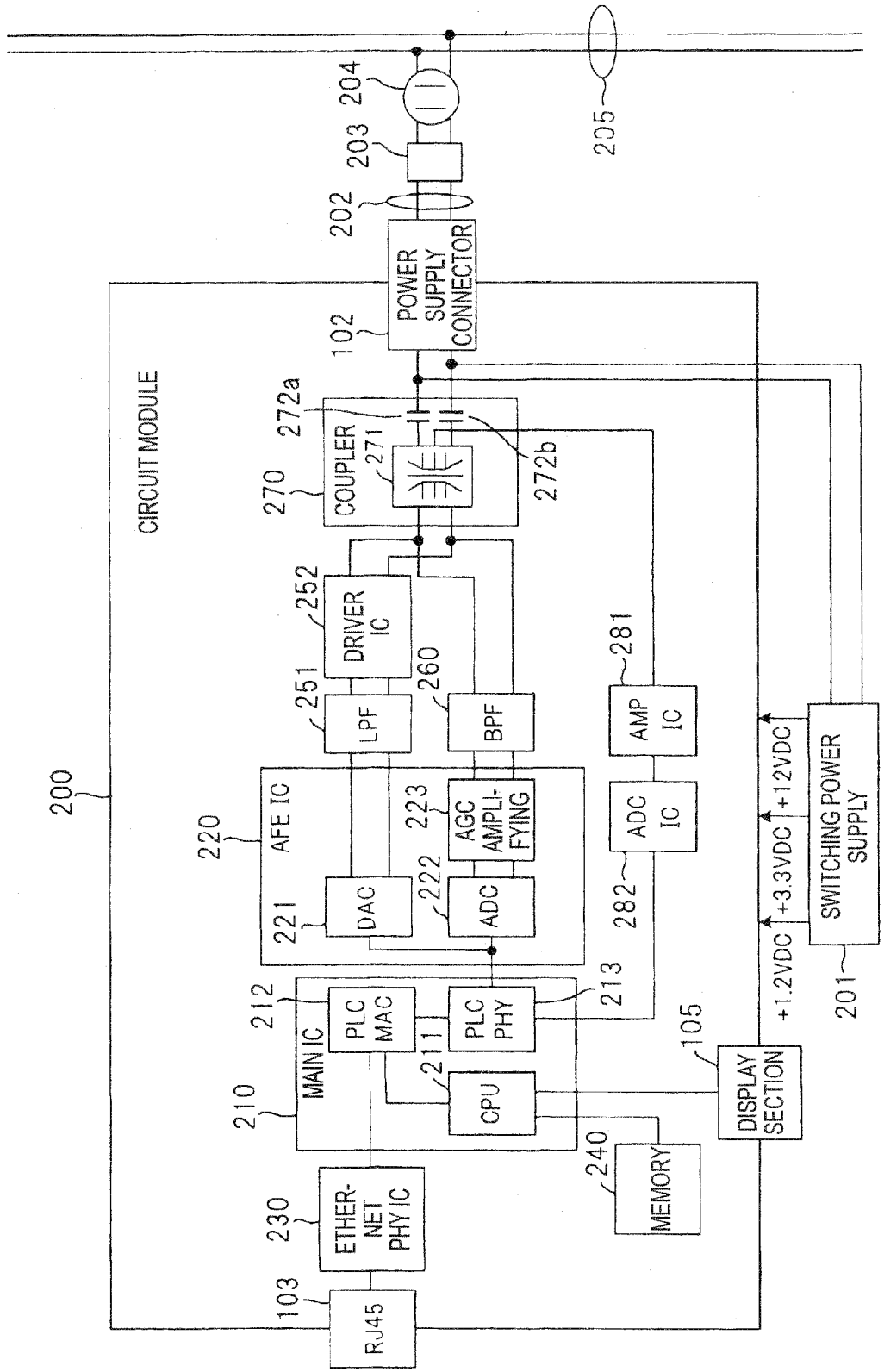

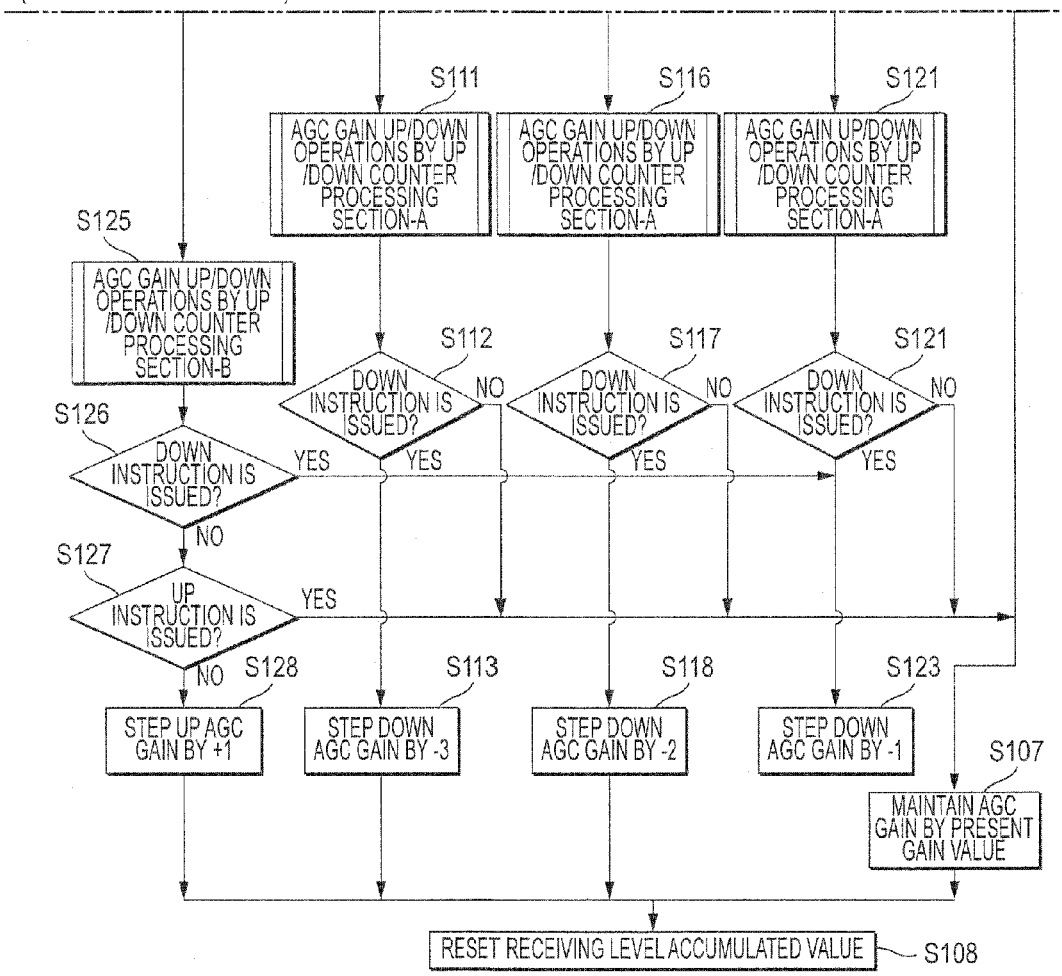

RECEIVING LEVEL CONTROL APPARATUS AND RECEIVER

BACKGROUND

The present invention relates to a receiving level control apparatus which controls a receiving level of a signal. More specifically, the present invention is directed to a receiving level control apparatus and a receiver, which are employed in a receiving circuit of a communication apparatus for performing a communication operation using a power line.

In power line communication apparatuses with employment of commercially available power lines as communication media, since leakage noises generated from power supply circuits of various sorts of consumer electric appliances may give adverse influences, high noise resistibility as to transmitting/receiving circuits of these power line communication apparatuses must be necessarily established. At the same time, impedance variation characteristics provided by electronic appliances which are connected to the power line communication apparatuses may constitute one of adverse factors. Under these reasons, multi-carrier communication systems have been proposed by which the same data is modulated on carriers over a plurality of frequency ranges, and data communication operations can be performed by utilizing such a frequency range with less adverse influence caused by noises, while avoiding such a frequency range that a large adverse noise influence is given, or another frequency range in which a large impedance variation is produced.

In the above-described multi-carrier communication systems, complex signal processing operations are required, so that longer data processing times than those of single carrier communication systems are necessarily required. As a consequence, in feedback control operations of AGC (Automatic Gain Control) circuits, processing times related to the feedback control operations must be necessarily shortened in order to improve communication performance, In the above-described feedback control operations, levels of input signals are controlled in such a manner that the signal levels become maximum within such a range that the controlled signal levels do not exceed maximum acceptable input levels of reception-purpose A/D converters.

Very recently, in order to improve communication efficiencies, shortening of symbol lengths of preambles in communication data is required. If the symbol lengths are shortened, then high-speed performance is furthermore required in AGC control operations which are performed in preamble portions. Accordingly, in order to realize high-speed communications, there is such a problem that response speeds in AGC feedback control operations become excessively slow.

In power line communication fields, electronic appliances are connected to and/or disconnected from power lines irrespective of communication operations to which power line communication apparatuses are connected. As a result, there is such a property that transmission characteristics of power lines corresponding to communication media are rapidly changed. Under such a property, there is another problem that in order to perform high-speed communication operations even when the transmission characteristics of the communication media are changed, high-speed AGC control operations are necessarily required.

FIG. 12 is a block diagram for showing a structural example of a receiving circuit containing an AGC circuit in a conventional communication apparatus. The receiving circuit contains a control section 51 which determines a gain of an AGC 52 based upon a reception analog signal "RD." The control section 51 includes a first control circuit 51a and a second control circuit 51b, Also, the receiving circuit is arranged by employing the AGC 52, an analog/digital (A/D) converting circuit 53, a serial/parallel (S/P) converting circuit 54, a fast Fourier transforming (FFT) circuit 55, a tone selector 56, a primary demodulator 57, and also, a deframing circuit 58 (refer to, for example, patent publication 1) The AGC 50 amplifies a reception analog signal "RS" in an amplification factor under control of the control section 51. The fast Fourier transforming circuit 55 transforms the received reception analog signal "RS" from temporal axis data to frequency axis data. The tone selector 56 extracts a specific tone signal from the frequency axis data derived from the fast Fourier transforming circuit 55 based upon an instruction issued from the control circuit 51. The deframing circuit 58 outputs reception data "RD"

In an AGC process operation, the first control circuit 51a performs a saturation judging operation from an output result of the A/D converting circuit 53, performs a loop back control until a result of the saturation judging operation becomes unsaturated, or until an AGC table is used up to the last table (namely, reaches table having minimum gain), and first of all, provisionally determines a gain of the AGC. After the gain of the AGC is provisionally determined, the FFT circuit 55 performs a frequency analyzing operation, and the tone selector 56 extracts frequency data which is used in data transmission. Then, the tone selector 56 calculates a vector length with respect to a plurality of extracted frequency components. The vector length obtained in this calculation constitutes a signal component from which frequency noises other than the signal frequency is eliminated. The second control circuit 51b compares this signal component with a previously set threshold level, and if the calculated vector length is larger than the threshold level, then the second control circuit 51b defines the provisionally determined gain value of the AGC as an AGC gain value. To the contrary, if the calculated vector length is smaller than the threshold level, then the second control circuit 51b selects such a 1-stage higher value (amplification factor) than the provisionally determined gain value of the AGC of the amplification factors which can be selected from the AGC use table. As a result, the control section 51 performs the level control operation in such a manner that the level of the reception analog signal becomes a maximum level within such a range which does not exceed a maximum acceptable input level of the A/D converter 53.

Also, other conventional AGC control techniques have been proposed. That is, in the AGC control operations, while a present gain value approaches a target value of a gain, both a threshold value for comparing differences between the target value and present values with each other, and an evaluation time period for performing the comparisons are changed. In this conventional technique, when the present value is converged to the target value, the evaluation period is prolonged, so that the gain control operation can be carried out in a higher efficiency.

[Patent Publication 1] JP-A-2002-353813
[Patent Publication 2] JP-A-2003-32057

In the arrangement of the conventional technique as disclosed in the above-described patent publication 1, when the AGC gain control operation is carried out, the gain can be merely changed every only 1 step during a predetermined constant time period. As a result, even when the AGC gain control operation is carried out in the highest speed, a converging time of such a time period for a plurality of step numbers up to the target value is required, so that there is a limitation in high-speed gain control operations.

Also, in another conventional technique disclosed in the above-described patent publication 2 in which both the threshold value and the evaluation period when the AGC control operation is carried out are changed, there is such a problem. That is, when the present gain value reaches the target gain value, since the evaluation time period is long, if the value which should be controlled is changed when the present gain value is approximated to the target value, then the AGC control operation can be hardly carried out in high speeds.

The present invention has been made to solve the above-described problems, and therefore, has an object to provide a receiving level control apparatus and a receiver, which can be realized with employment of a simple arrangement while a complex processing operation is not employed, and which can perform a high-speed AGC operation with a high sensitivity.

SUMMARY

In order to achieve the above object, according to the present invention, there is provided a receiving level control apparatus, comprising:

an amplifier to receive a signal and to amplify the signal based on a gain control signal;

a memory to store an accumulated level of the amplified signal at every sampling period; and a gain control section to judge whether or not the accumulated level, which has been accumulated from a first time instant, exceeds a first reference value at a predetermined timing, and to control the gain control signal for the amplifier in response to a length of a time period defined from the first time instant up to a second time instant in a case that the accumulated level exceeds the first reference value, the second time instant defined as a time instant when the gain control section judges that the accumulated level exceeds the first reference value.

With employment of the above-described arrangement, at the time instant when the accumulated level exceeds the first reference value, the gain of the amplifier is changed based upon the adjusting amount in response to the length of the time period elapsed from the first time instant. As a result, the accumulation level can be judged and the gain can be changed based upon the judgment result within a short time, so that a high-speed receiving level control operation can be realized by executing a process operation within a short time.

BRIEF DESCRIPTION OF THE DRAWINGS

The above objects and advantages of the present invention will become more apparent by describing in detail preferred exemplary embodiments thereof with reference to the accompanying drawings, wherein:

FIG. 1 is a diagram for indicating an outer appearance of a power line communication apparatus.

FIG. 2 is a block diagram for showing one example as to hardware of the power line communication apparatus.

DETAILED DESCRIPTION OF EXEMPLARY EMBODIMENTS

In this embodiment, as a receiving level control apparatus employed in a communication apparatus, it will be explained that an exemplification of a power line communication apparatus (PLC (Power Line Communication) modem) which is employed in a multi-carrier transmission type power line communication system using a power line as a transmission path for performing a communication.

Figure 1A:
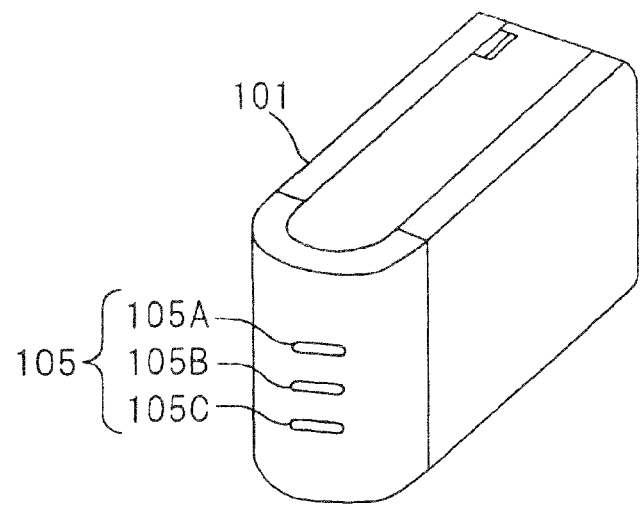
FIG. 1A is perspective view for showing the outer appearance of the power line communication apparatus.
Figure 1B:
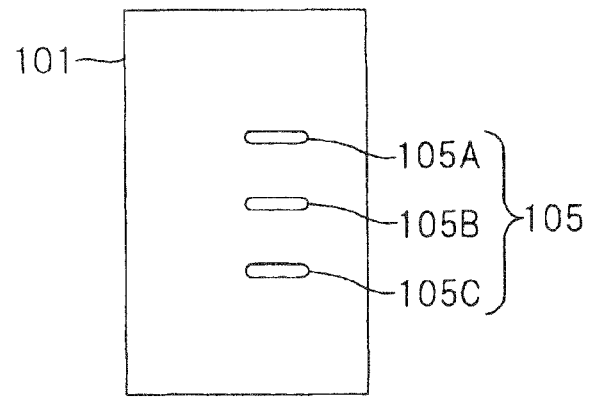
FIG. 1B is a front view of the power line communication apparatus.
Figure 1C:
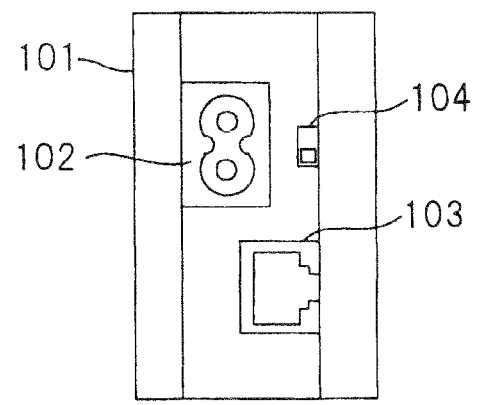
FIG. 1C is a rear view of the power line communication apparatus.

FIG. 1A is a perspective view for showing the outer appearance of the power line communication apparatus, FIG. 1B is a front view of the power line communication apparatus, and FIG. 1C is a rear view of the power line communication apparatus.

Figure 10:
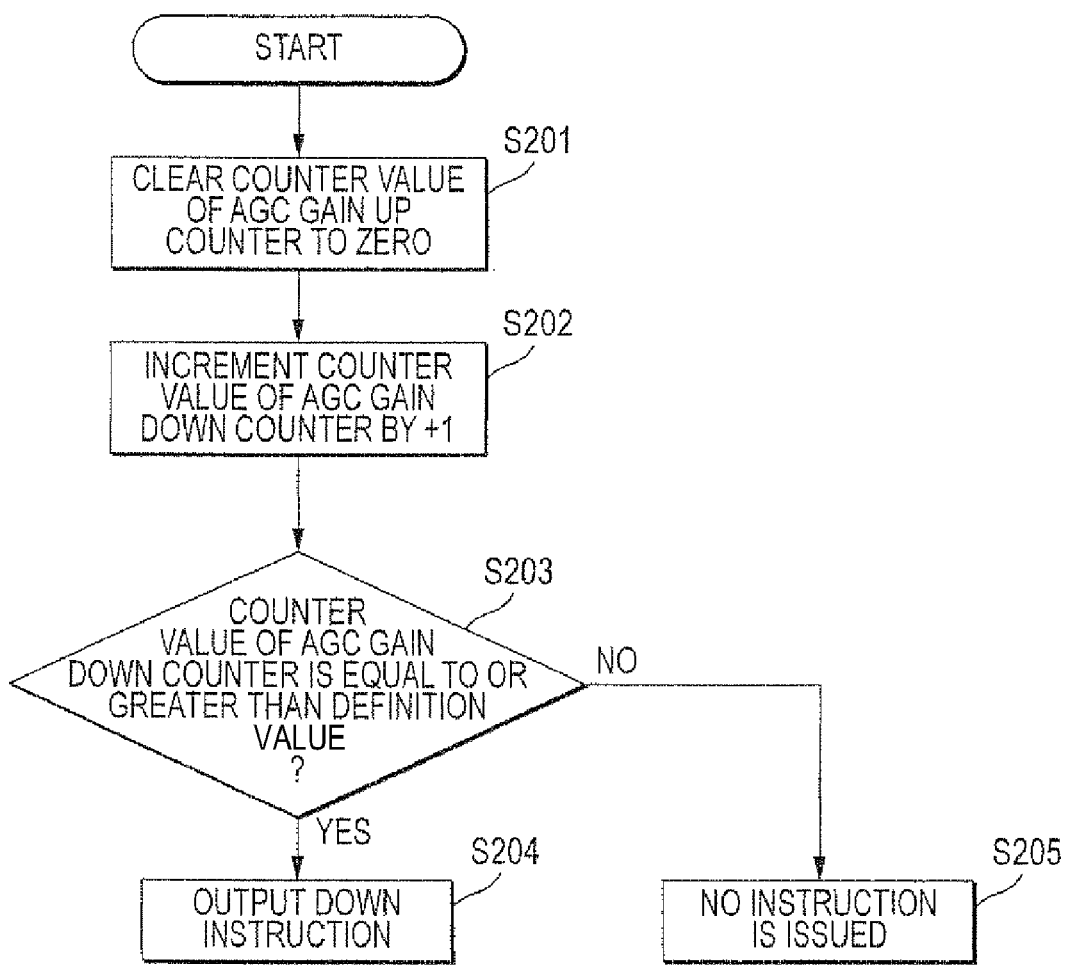
FIG. 10 is a flow chart for describing a process sequence as to operations of an up/down counter processing section-A in the embodiment.

The power line communication apparatus includes a housing 101. As shown in FIG. 1A and FIG. 1B, a display section 106 constructed of LEDs (Light Emitting Diodes) 105A, 105B and 105C are provided on a front face of the housing 101. Also, as shown in FIG. 10, a power supply connector 102, a LAN (Local Area Network)-purpose modular jack 103 such as RJ45, and a selecting switch 104 for selectively switching operation modes and the like are provided on a rear face of the housing 101. A power supply cable (not shown in FIG. 1) is connected to the power supply connector 102, and also, a LAN cable (not shown in FIG. 1) is connected to the modular jack 103. A D-SUB (D-subminiature) connector may be further provided in the power line communication apparatus, and a D-SUB cable may be connected to the D-SUB connector. As apparent from the foregoing descriptions, other connectors known in this technical field may be alternatively provided in the power line communication apparatus. Also, as the display section 105, in addition to a plurality of LEDs, colors may be changed by operating a single LED, and/or communication speeds and the like may be displayed on an liquid crystal display, an EL display, and the like. Although the structure of the PLC modem is explained as the power line communication apparatus shown in FIG. 1, an electronic appliance (for example, consumer electric products such as television) equipped with the PLC modem may be alternatively employed.

FIG. 2 is a block diagram for representing one example as to hardware of the power line communication apparatus. As shown in FIG. 2, the power line communication apparatus includes a circuit module 200 and a switching power supply 201. The switching power supply 201 supplies various sorts of voltages (for example, +1.2 V, +3.3 V, and +12 V) to the circuit module 200. The switching power supply 201 includes, for example, a switching transformer and a DC/DC converter (both circuit elements are not shown).

The circuit module 200 includes a main IC (Integrated Circuit) 210, an AFE•IC (Analog Front End IC) 220, a low-pass filter (LPF) 251, a driver IC 252, a coupler 270, a band-pass filter (BPF) 260, a memory 280, an Ethernet (registered trademark) PHY•IC (Physical layer-integrated Circuit) 230, an AMP (Amplifier) IC 281, and an ADC (A/D converting) IC 282. Both the switching power supply 201 and the coupler 270 are connected to the power supply connector 102, and furthermore, are connected via a power supply cable 202, a power supply plug 203, and an outlet plug 204 to a transmission path 205.

The main IC 210 includes a CPU (Central Processing Unit) 211, a PLC•MAC (Power Line Communication•Media Access Control layer) block 212 and a PLC•PHY (Power Line Communication•Physical layer) block 213. The CPU 211 has a 32-bit RISC (Reduced Instruction Set Computer) processor, The PLC•MAC block 212 manages MAC layers (Media Access Control layers) of a transmission signal and a reception signal, Also, the PLC•PHY block 213 manages PHY layers (Physical layers) of the transmission signal and the reception signal, The AFE•IC 220 includes a D/A converter (DAC) 221, an A/D converter (ADC) 222, and an AGC amplifier 223. The coupler 270 has a coil transformer 271 and coupling-purpose capacitors 272a and 272b. The CPU 211 controls operations of the PLC•MAC block 212 and the PLC•PHY block 213, and also controls the entire operations of the power line communication apparatus by utilizing data stored in the memory 240.

A communication operation by the above-described power line communication apparatus is roughly carried out as follows. That is, communication data transmitted from an external communication apparatus (not shown) via the modular jack 103 is supplied via the Ethernet (registered trademark) PHY•IC 230 to the main IC 210 and the supplied data is digitally processed so that a digital transmission signal is produced. The produced digital transmission signal is D/A-converted into an analog signal by the D/A converter (DAC) 221 of the AFE•IC 220, and then, the analog signal is outputted to the transmission path 205 via the low-pass filter 251, the driver IC 252, the coupler 270, the power supply connector 102, the power supply cable 202, the power supply plug 203, and the outlet plug 204.

A signal received from the transmission path 205 is supplied via the coupler 270 to the band-pass filter 260, and then, a gain of the supplied analog signal is controlled by the AGC amplifier 223 of the AFE•IC 220. Thereafter, the gain-controlled analog signal is ND-convened by the A/D converter (ADC) 222 into a digital signal, and then, the digital signal is supplied to the main IC 210 so as to be digitally processed. Then, this digital data is outputted via the Ethernet PHY•IC 230 from the modular jack 103.

The power line communication apparatus performs a multi-carrier communication operation based upon modulation signals of multiple carriers with employment of a plurality of sub-carriers produced by the OFDM (Orthogonal Frequency Division Multiplexing) system, and the like. In the power line communication apparatus, a digital processing operation such as converting transmission data to an OFDM transmission signal, and then converting an OFDM reception signal to reception data, is mainly carried out by the PLC•PHY block 213.

Figure 3:
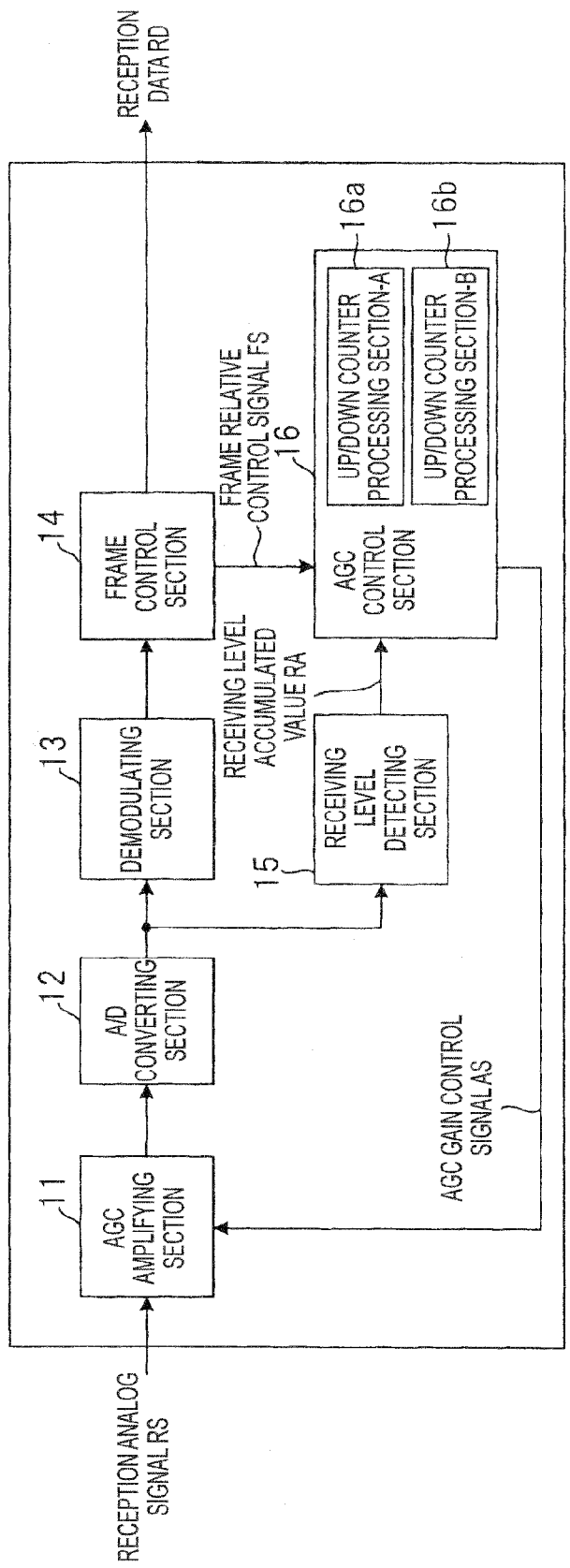
FIG. 3 is a block diagram for indicating an arrangement of a receiving level control apparatus according to an embodiment of the present invention.

FIG. 3 is a block diagram for showing an arrangement of a receiving level control apparatus according to an embodiment of the present invention. While the receiving level control apparatus corresponds to the AFE IC 220 and the main IC 210 provided in the above-described power line communication apparatus, the receiving level control apparatus performs a receiving level control operation by an AGC amplifier employed in the receiver of the power line communication apparatus. Both an AGC amplifying section 11 and an A/D converting section 12 correspond to the AFE IC 220, whereas a demodulating section 13, a frame control section 14, a receiving level detecting section 15, and an AGC control section 16 correspond to the main IC 210.

While the AGC amplifying section 11 has a gain controllable amplifier which amplifies a reception analog signal "RS" so as to adjust a level of the amplified reception analog signal "RS", the AGC amplifying section 11 controls a level of an input signal in such a manner that the controlled level of the input signal becomes a maximum level within such a range that the maximum level does not exceed a maximum acceptable input level of a reception-purpose A/D converter employed in the A/D converting section 12 provided at a post stage of the AGC amplifying section 11. The AND converting section 12 converts the reception analog signal "RS" whose level is adjusted into a digital signal. The demodulating section 13 performs various sorts of processing operations with respect to a digitally sampled reception signal, namely, the digitally sampled reception signal is converted from temporal axis data to frequency axis data by FFT (Fast Fourier Transform); the reception data is converted in a serial-to-parallel converting manner; a specific tone signal is extracted from the frequency axis data; and a modulation signal produced by performing a preset primary modulating system is demodulated. The frame control section 14 extracts carrier signal and a synchronization word signal, which are contained in the reception data, based upon the reception data outputted from the demodulating section 13, and also, performs a processing operation for reproducing a frame structure (will be discussed later). Also, in such a case that each of frames can be received while extracting carrier signal, the frame control section 14 outputs an AGC locking signal in order to maintain an AGC gain in the AGC amplifying section 11.

The receiving level detecting section 15 has a memory for storing thereinto accumulated values which are obtained by accumulating receiving levels every A/D sampling timing from the digitally sampled reception signals outputted from the A/D converting section 12. The receiving level detecting section 15 averages the receiving levels, and thereafter, detects a receiving level thereof. Also, the receiving level detecting section 15 outputs a receiving level accumulated value "RA" to the AGC control section 16. The AGC control section 16 may realize the function of the gain control section. That is, the AGC control section 16 outputs an AGC gain control signal "AS" for setting an AGC gain of the AGC amplifying section 11 based upon a frame relative control signal "FS" such as a transmission starting signal, a transmission completion signal, a carrier detecting signal, a synchronizing signal, and an AGC locking signal which are outputted from the frame control section 14; and also based upon an accumulated value "RA" of receiving levels, which is outputted from the receiving level detecting section 15. Also, the AGC control section 16 has such a function as to an up/down counter processing section-A 16a, and another up/down counter processing section-B 16b.

Figure 4:
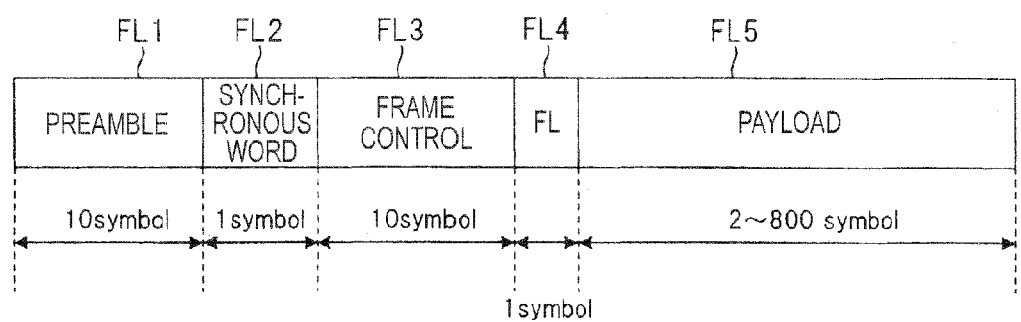
FIG. 4 is a diagram for representing a structure of a frame of a reception signal, and a structure of a field in the above-described frame.

FIG. 4 is a diagram for indicating a structure of a frame of a reception signal which is reproduced by the frame control section 14, and a structure of fields contained in the above-described frame.

In the communication apparatus of this embodiment, the communication apparatus receives such a signal having the frame structure shown in FIG. 4. The frame is constituted by a preamble field "FL1" which is an area for detecting a carrier; a synchronous word field "FL2" which is an area of a predetermined fixed code; a frame control field "FL3" which indicates a sort of a frame and a destination of a communication destination; a FramaLength (FL) field "FL4" which is an area of a signal for indicating a length of a payload; and a payload field "FL5" which is a data portion, In this embodiment, the above-described preamble field "FL1" is defined as a repetition pattern of the known data over 10 symbol sections.

In this case, the symbol indicates a unit of one group in modulations and demodulations, namely, in a phase shift keying system, such a unit of one group of BPSK, QPSK, 8PSk, and the like; in a quadrature amplitude modulation system, such a unit of one group of 16QAM, 64QAM, 256QAM, and the like; otherwise, in an orthogonal frequency division multiplexing system, such a unit of one group of modulations.

In the preamble field "FL1", the demodulating section 13 judges whether or not a carrier is detected by utilizing correlation as to data (generally speaking, capable of also utilizing symbol-to-symbol correlation, and sub-carrier-to-sub-carrier correlation); and when the carrier is detected, the demodulating section 13 outputs a carrier detection signal. This carrier detection signal is transmitted to the AGC control section 16. In the time period of this preamble field FL1, the AGC control section 16 outputs an AGC gain control signal "AS", and controls the AGC gain of the AGC amplifying section 11 based upon the AGC gain control signal "AS" so as to perform the AGC operation thereof. In such a case that the AGC operation is converged and the reception data could be demodulated while extracting carrier signal, the frame control section 14 outputs an AGC locking signal so as to directly lock the AGC gain based upon the gain obtained at this time. If the AGC locking signal is asserted (becomes valid), then the AGC control section 16 maintains the AGC gain situation of the AGC amplifying section 11 until the reception operation is accomplished.

In the synchronous word field FL2, final data under used in the preamble field "FL1" are formed as such a data pattern having a certain regular characteristic by inverting the final data (if final data of preamble field FL1 is repetition data, then data of synchronous data is "0"), and thus, the data pattern having the certain regular characteristic is utilized in order to establish a synchronization within a field, or a synchronization within a frame.

A next symbol subsequent to the symbol from which the synchronous word is detected is an area of the frame control field FL3. When a unique ID such as an MAC address within this frame control field FL3 is made coincident with each of IDs owned by communication apparatuses provided on the reception side, such judgment is made that the transmitted data is data directed to the own communication apparatus, and then, an FL field "FL4" subsequent to the above-described frame control field "FL3" and a payload field "FL5" are reproduced. If the unique ID contained in the frame control field "FL3" is not made coincident with an ID owned by another communication apparatus, then the FL field "FL4" and the payload field "FL5", which are subsequent to the frame control field "FL3", are discarded.

Also, when the payload field "FL5" is reproduced and then an end point of this payload field "FL5" is sensed, the AGC signal is released so as to prepare an input of a next frame.

The FL field "FL4" corresponds to such a field indicative of a data number of the payload field "FL5" subsequent to this FL field "FL4." A communication apparatus on the reception side decrypts the value of this FL field "FL4", and controls a data waiting time based upon the decrypted value.

Figure 5:
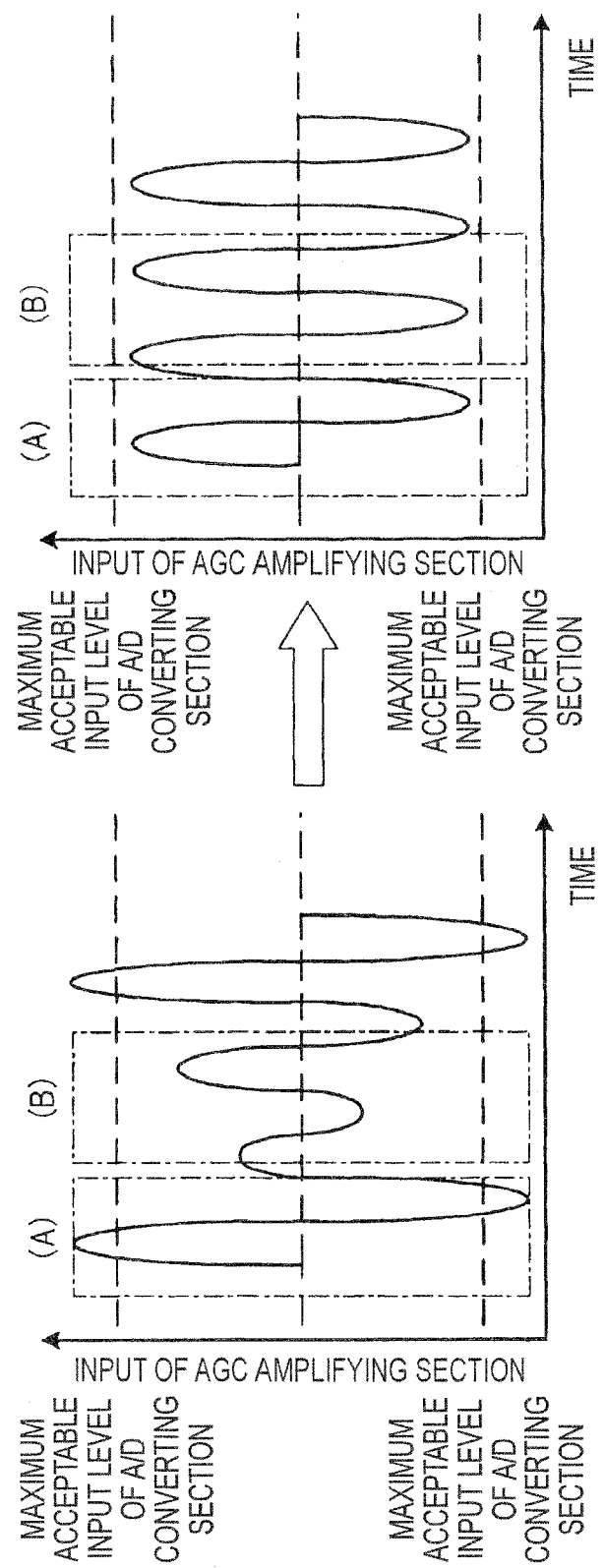
FIG. 5 is an explanatory diagram for explaining an AGC operation.

FIG. 5 is an explanatory diagram for explaining an AGC operation. Since a dynamic range of the A/D converting section 12 is finite, this dynamic range must be effectively utilized. To this end, the AGC control section 16 performs a feedback control operation with respect to the AGC gain of the AGC amplifying section 11 in such a manner that a level of an analog signal to the A/D converting section 12 may become a maximum signal level within such a range that this input signal level does not exceed a maximum acceptable input level held by the A/D converting section 12.

If the AGC operation is be properly carried out and thus an input level to the A/D converting section 12 exceeds the maximum acceptable input level, an digital signal outputted from the A/D converting section 12 becomes non-linear, and therefore, there are some possibilities that the non-linear digital signal cannot be demodulated in the subsequent stage. Since it is required to avoid that a non-linear signal is generated in order to execute a signal processing operation, the input acceptable range of the A/D converting section 12 must be determined with having a certain margin with respect to the maximum acceptable input level.

Now, as represented by symbol (A) of a left side in FIG. 5, in a case that an input level of the A/D converting section 12 exceeds the determined maximum acceptable input level, the AGC amplifying section 11 is controlled by the AGC control section 16 in such a manner that the AGC amplifying section 11 outputs a signal whose level is attenuated. Also, as shown by symbol (B) of the left side in FIG. 5, in a case that an input level of the A/D converting section 12 is lower than the determined maximum acceptable input level, the AGC amplifying section 11 is controlled by the AGC control section 16 in such a manner that the AGC amplifying section 11 outputs a signal whose level is amplified. In other words, the AGC control section 16 performs the feedback control operation in such a manner that an input level of the AD converting section 12 becomes the maximum level within such a range that this input level does not exceed the input acceptable range (namely, range of input level which is slightly lower than maximum acceptable input level by margin). As a result such a signal having a substantially constant amplitude level is outputted from the AGC amplifying section 11, as shown in the right side of FIG. 5, and thus, the A/D converting section 12 receives a signal having a substantially constant level which is previously determined. In accordance with the above-described AGC operation, the AGC amplifying section 12 can improve a reception sensitivity by effectively utilizing the dynamic range of the A/D converting section 12.

Next, a featured operation executed in the receiving level control apparatus according to this embodiment will be explained. In this embodiment, an AGC control operation is carried out by changing the AGC gains in time intervals which are defined by dividing a predetermined time period (for example, 1 symbol period) by the plural number. In the AGC control operation, under initial status, the AGC control operation is commenced under such a condition that the AGC gain is set to a maximum level, the AGC gain level is reduced every step from the maximum level until the AGC gain level is converged up to a proper AGC gain level. In this case, the receiving level detecting section 15 accumulates a receiving level of an input signal outputted from the A/D converting section 12 every A/D sampling timing, and thereafter, outputs an accumulated value of the receiving levels to the AGC control section 16. The AGC control section 16 compares the accumulated value of the receiving levels with a first reference level corresponding to a first threshold level (predetermined reference value); and at such a time instant when the receiving level accumulated value within each of these divided AGC control times exceeds the first reference level, the AGC control section 16 outputs an AGC gain control signal "AS" to the AGC amplifying section 11 to decrease the AGC gain every step. Also, depending upon a time period during which the accumulated value of the receiving levels exceeds the first reference level, a gain adjusting step number per 1 time is changed in response to the elapsed time period in such a manner that when the accumulated value exceeds the first reference level within a short time, the reducing amount of the AGC gain is increased, and thus, the AGC gain is decreased by a predetermined step number.

Figure 6:
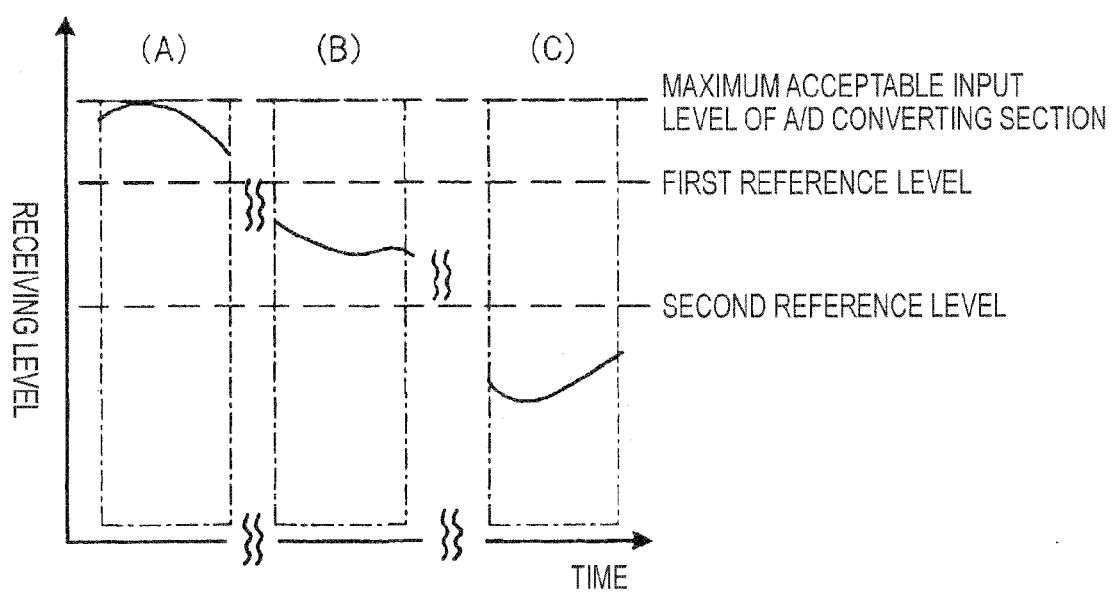
FIG. 6 is an explanatory diagram for explaining a reference level which is employed in the AGC control operation of this embodiment.

FIG. 6 is an explanatory diagram for explaining reference levels employed in the AGC control operation of this embodiment. A first reference level and a second reference level correspond to threshold values indicative of predetermined receiving levels which are employed in judging operations when an AGC gain is controlled. The first reference level is such a threshold value which is employed in a judging operation for decreasing the AGC gain. A large/small relationship between the first reference level and the maximum acceptable input level of the A/D converting section 12 is given as follows: (maximum acceptable input level of A/D converting section 12)>(first reference level). As a standard level, it is so set: (maximum acceptable input level of A/D converting section 12)=(first reference level)+12 dB. The second reference level corresponding to the second threshold value (second predetermined reference value) is such a threshold value which is employed in a judging operation for increasing the AGC gain. A large/small relationship between the second reference level and the first reference level is given as follows: (first reference level)>(second reference level).

In FIG. 6, in the case of a situation (A), since a receiving level exceeds the first reference level, the AGC control section 16 steps down the AGC gain from the preceding AGC gain value (namely, gain is changed to become low). Also, in the case of another situation (B), since a receiving level is lower than the first reference level and exceeds the second reference level, the AGC control section 16 can regard this situation (B) as a properly set AGC gain, so that the AGC control section 16 maintains the present AGC gain. Further, in the case of a further situation (C), since a receiving level is lower than the second reference level, in such a case that this level situation (C) is continued for a time period equal to or greater than a predetermined time period, the AGC control section 16 steps up the AGC gain from the preceding AGC gain value (namely, gain is changed to become high).

Figure 7:
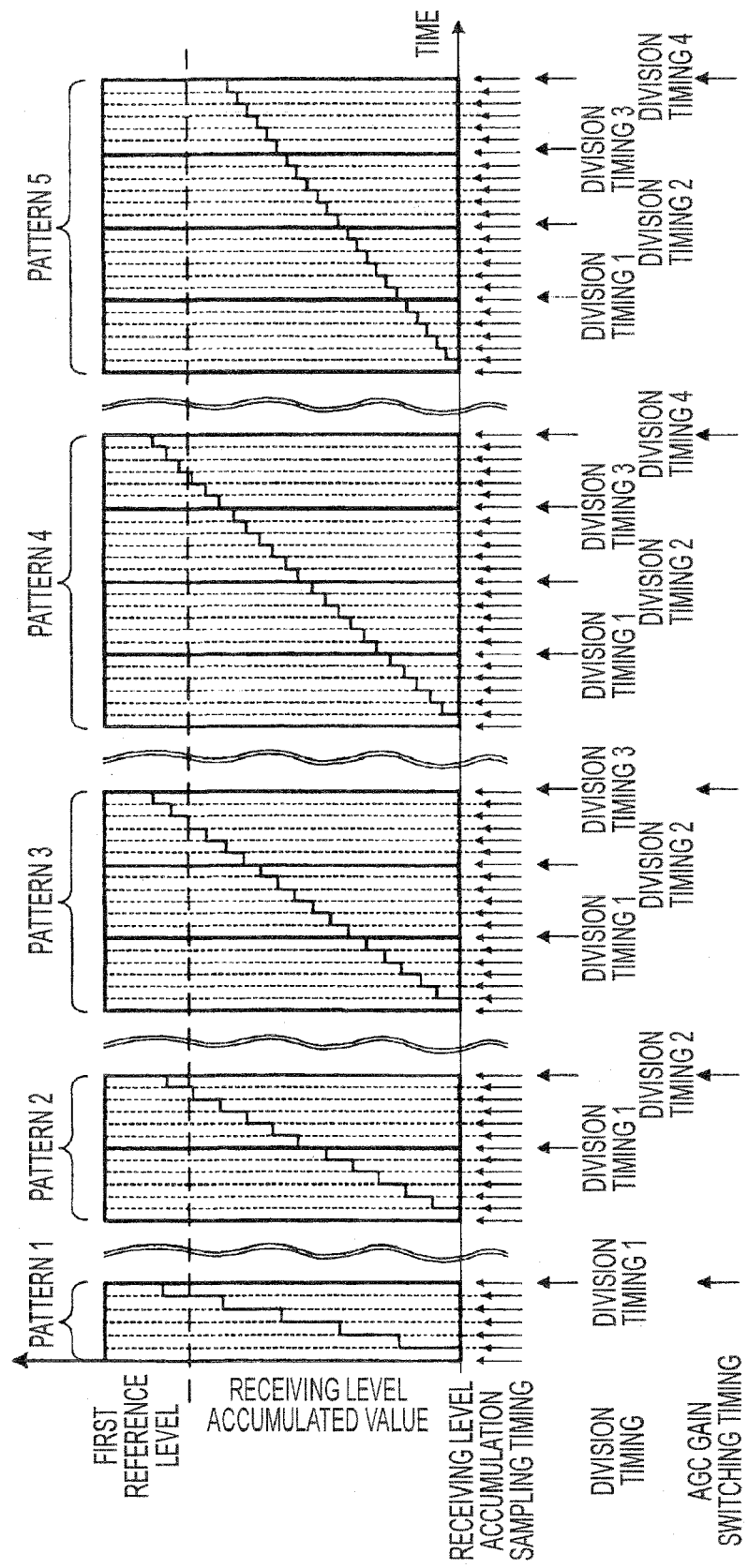
FIG. 7 is an explanatory diagram for explaining an accumulated value of receiving levels, dividing timing of AGC control time, and AGC gain switching timing in the receiving level control apparatus of this embodiment.

FIG. 7 is an explanatory diagram for explaining dividing timing as to accumulated values of receiving levels and AGC control times, and also, AGC gain switching timing. In the example of FIG. 7, a time period of 1 symbol of demodulation data is sub-divided by "N" (symbol "N" is integer), and each of N-divided timing will be referred to as "division timing." While N=4 in this example, and the respective division timing will be sequentially referred to as "division timing 1", "division timing 2", "division timing 3", and "division timing 4", a description is made of operations. It is so assumed that a first reference level indicated in FIG. 7 indicates such a threshold level for judging an accumulated value of receiving levels equivalent to values appeared on the receiving levels of FIG. 6. It is also assumed that timing for accumulating receiving levels (namely, receiving level accumulation sampling timing indicated in FIG. 7) is defined as A/D sampling timing when receiving level data is outputted from the A/D converting section 12.

At the division timing 1 to the division timing 3, in such a case that a receiving level accumulated value becomes larger than the first reference level before a time reaches to a timing of 1 symbol period (equal to division timing 4), namely, in case of patterns 1, 2, 3 shown in FIG. 7, the AGC control section 16 steps down the AGC gain from the preceding AGC gain value (namely AGC gain is changed to become small) at division timing at this time instant without waiting for the timing of 1 symbol period so as to switch the AGC gains. This timing is assumed as AGC gain switching timing, in which the AGC gain can be switched.

A step unit of an AGC control operation can be set by a communication system. In a power line communication apparatus, when a balance between a convergence of AGC gain levels and gain precision is considered, the above-described step unit may be properly set by 3 to 6 dB/step. Also, the step down number may be changed in response to time when a receiving level exceeds the first reference level by checking which division timing "N" at which this receiving level exceeds the first reference level. In this embodiment, the step down number is assumed as follows: That is, in the case of the pattern 1 (namely, AGC gain is switched at division timing 1), the step down number is defined by −3 step down; in the case of the pattern 2 (namely, AGC gain is switched at division timing 2), the step down number is defined by −2 step down; and in the case of the pattern 3 (namely, AGC gain is switched at division timing 3), the step down number is defined by −1 step down. In this AGC gain switching timing for switching the AGC gain, the receiving level accumulated value is reset to zero of the initial value at the same time, and thereafter, the receiving levels are accumulated in a similar manner.

In the case that a receiving level accumulated value does not exceed the first reference level until 1 symbol period has elapsed (in case of patterns 4 and 5), the AGC control section 16 compares the first reference level with an accumulated value at timing (namely, division timing 4) of 1 symbol. In such a case of the pattern 4 (equivalent to situation (A) of FIG. 6), since the receiving level accumulated value exceeds the first reference level, the AGC control section 16 steps down the AGC gain from the preceding AGC gain value by 1. In such a case of the pattern 5 (equivalent to situation (B) of FIG. 6), although the receiving level accumulated value does not exceed the first reference level, since this receiving level accumulated value exceeds the second reference level, the AGC control section 16 maintains the present AGC gain without stepping down the AGC gain value. Then, while the division timing 4 of the 1 symbol period is defined as the AGC gain switching timing, at this AGC gain switching timing, the receiving level accumulated value is reset at the same time in a similar manner to the above-explained patterns 1 to 3.

Figure 8:
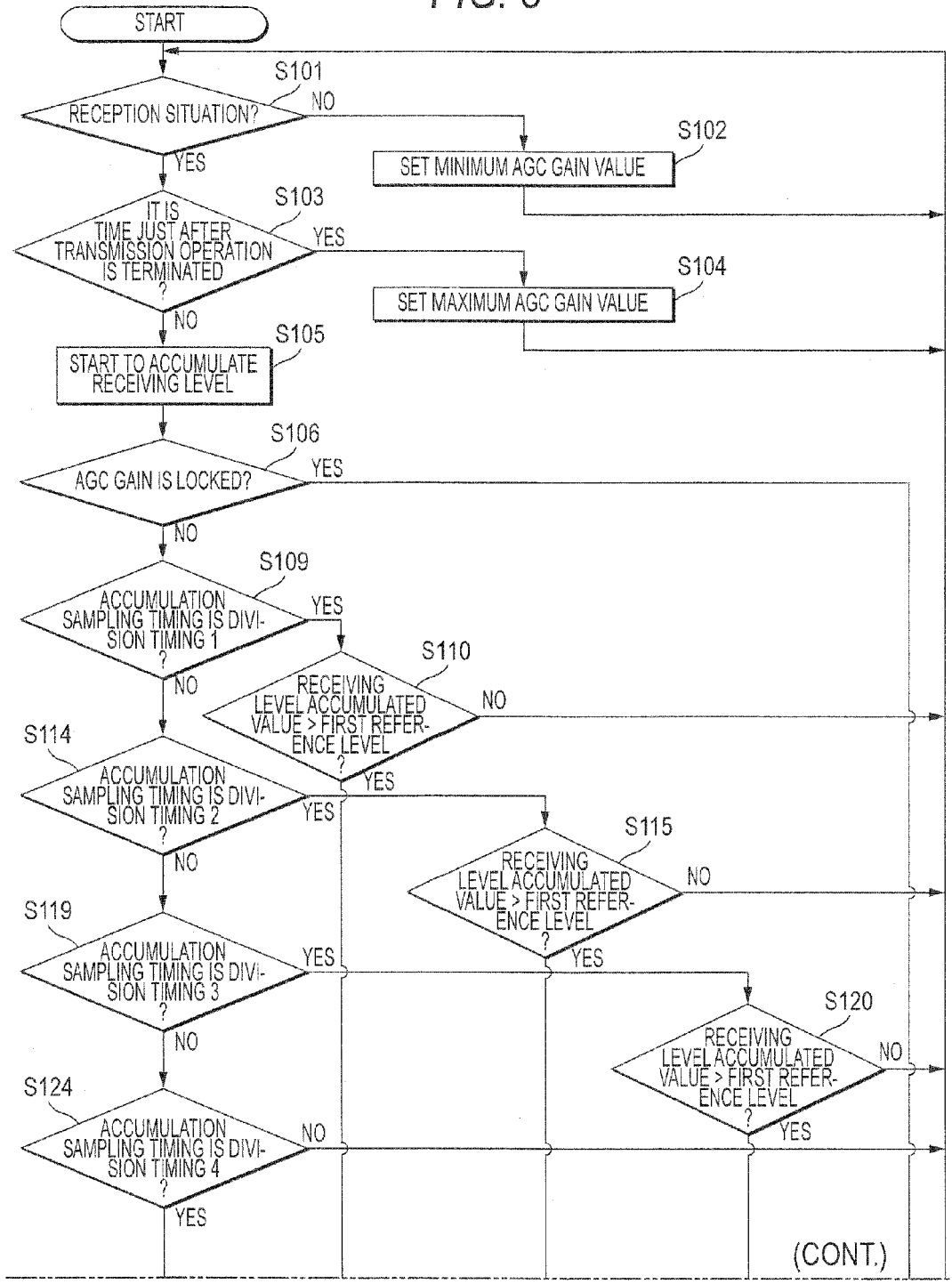
FIG. 8 is a flow chart for describing a process sequence of AGC control operation executed in the receiving level control apparatus of the embodiment.

FIG. 8 is a flow chart for describing a process sequence of an AGC control operation which is executed by the receiving level control apparatus according to this embodiment. This flow chart of FIG. 8 mainly represents operations of the AGC control section 16.

The AGC control section 16 judges whether or not the communication apparatus is presently under reception condition based upon a frame relative control signal "FS" supplied from the frame control section 14 (step S101). In this example, the above-described "reception condition" implies such a condition that a transmission signal is not outputted from the transmitting circuit of the above-described communication apparatus (namely, non-transmission condition). If the communication apparatus is not under reception condition (namely, communication apparatus is under transmission condition), then the AGC control section 16 sets the AGC gain to a minimum value (minimum AGC gain level) with respect to the AGC amplifying section 11 in order to avoid an adverse influence given to the receiving circuit which is caused by detouring the transmission signal into this receiving circuit (step S102). Then, the process operation is returned to the reception condition judging process operation of the step S101.

On the other hand, in the case that the communication apparatus is under reception condition, the AGC control section 16 furthermore judges whether or not it is a time just after the reception operation is commenced (step S103). In this case, if the time is just after the reception operation is commenced (namely, time instant when reception operation is commenced), then the AGC control section 16 sets the AGC gain to a maximum value (maximum AGC gain level) with respect to the AGC amplifying section 11 (step S104). As a result, the AGC control section 16 prepares for waiting operation capable of receiving even a very low signal. Then, the process operation is returned to the reception condition judging process operation of the step S101.

While the AGC gain is set to the maximum value, the receiving level detecting section 15 starts to accumulate a receiving level of a reception signal from such a time instant when the communication apparatus commences the reception operation (step S105). In this case, the receiving level detecting section 15 accumulates an output receiving level outputted from the A/D converting section 12 at such a timing of the receiving level accumulation sampling. Although a time period of the receiving level accumulation sampling is arbitrarily determined, this time period is normally defined by employing the same time period as that of the A/D sampling timing which is used by the A/D converting section 12.

Subsequently, the AGC control section 16 judges whether or not an AGC locking signal is outputted from the frame control section 14 so as to issue a locking instruction for maintaining the AGC gain (step S106). Now, in such a case that the locking instruction of the AGC gain is issued, the AGC control section 16 maintains the present AGC gain as the preceding AGC gain value (step S107). In the case that the reception operation is being carried out while extracting carrier signal, the AGC locking signal is generated from the frame control section 14 so as to issue the locking instruction. As a result, the AGC gain can be maintained even in a halfway of a frame. Thereafter, the AGC control section 16 resets the receiving level accumulated value to zero of the initial value (step S108). The process operation is returned to the reception condition judging process operation of the step S101 in which the AGC control section 16 restarts to accumulate receiving levels, and to judge the accumulated value.

Figure 9:
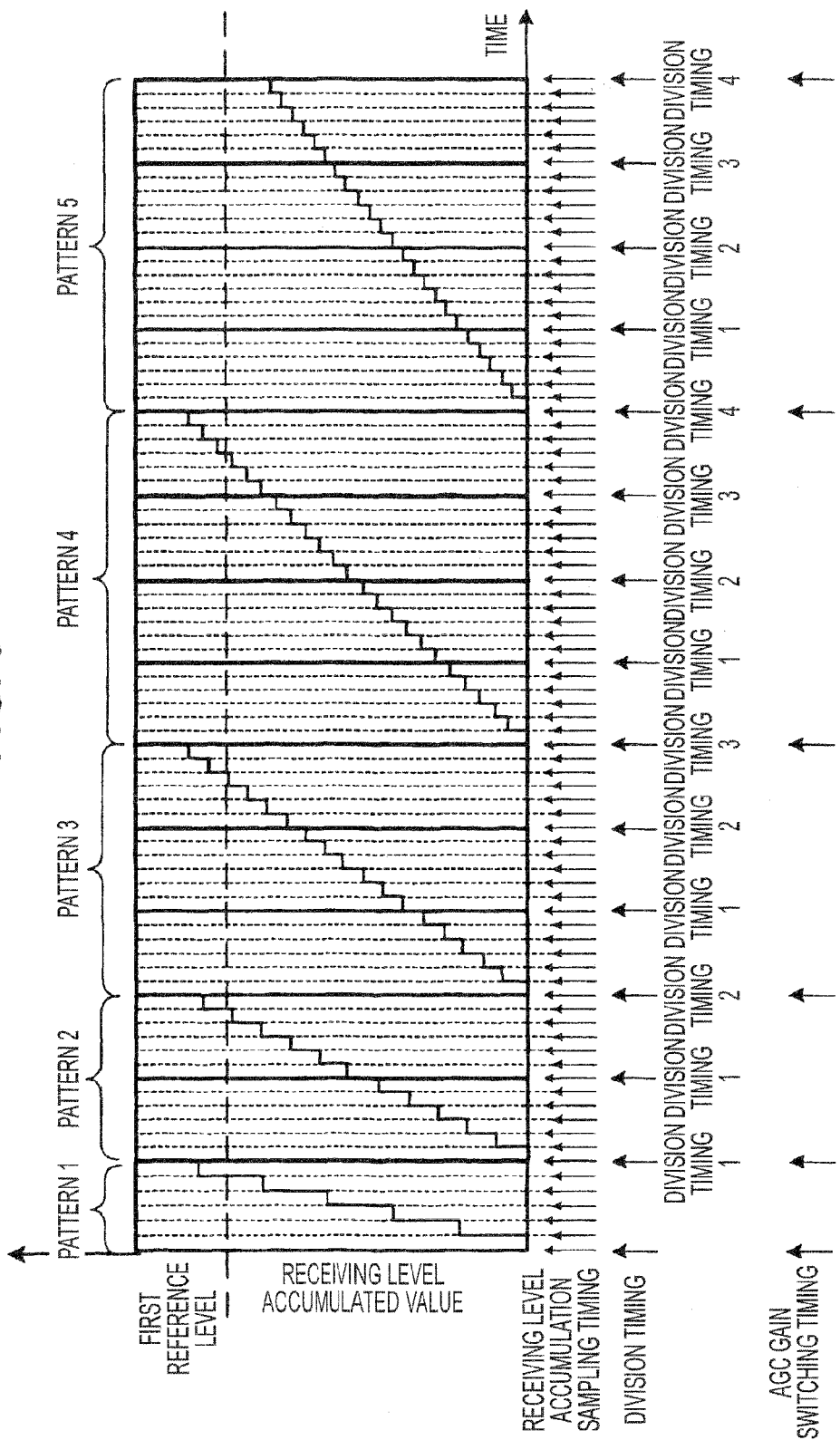
FIG. 9 is a diagram for representing respective patterns of the receiving level accumulated values shown in FIG. 7 in correspondence with the AGC control operations of FIG. 8.

In the case that the locking instruction of the AGC gain is not issued, the AGC control section 16 judges receiving levels accumulated by the receiving level detecting section 15 in the succeeding step so as to switch the AGC gain, or maintain the AGC gain based upon a magnitude of the receiving level accumulated value, and an accumulation time, FIG. 9 is a diagram for representing the respective patterns of the receiving level accumulated values shown in FIG. 7 in a continuous manner in correspondence with the process operations of FIG. 8. In the case that a level of reception data outputted from the A/D converting section 12 has a certain high level, when the AGC gain is set to the maximum AGC gain value by the step S104 just after the reception operation is commenced, the receiving level accumulated value reaches the first reference level within a such a short time (within division timing 1) as the pattern 1. In the case of the pattern 1, the AGC gain is decreased by the large step number (−3 step down) within the short time (division timing 1).

If the AGC gain becomes small by performing this AGC control operation and then the reduced AGC gain is approximated to a proper gain value, then an accumulating speed (increasing speed of accumulated value) of the receiving levels becomes slow. As a result, as shown in the pattern 2, the accumulated value of the receiving levels reaches the first reference level within a longer time (within division timing 2) than the time of the pattern 1. Furthermore, if the AGC gain becomes small and then the reduced AGC gain is approximated to a proper gain value, then such a time required to reach the first reference level is prolonged as indicated in a pattern 3 and a pattern 4. In each of the patterns 2 to 4, the AGC gain is decreased at such a division timing when the reception time accumulated value exceeds the first reference level by the step numbers (−2 step down to −1 step down) in response to the exceeded time period.

In the case that the locking instruction of the AGC gain is not issued, first of all, the AGC control section 16 judges whether or not present timing of the receiving level accumulation sampling is the division timing 1 (step S109). When the present receiving level accumulation sampling timing corresponds to the division timing 1, the AGC control section 16 compares a receiving level accumulated value with the first reference level so as to judge whether or not the receiving level accumulated value is larger than the first reference level (step 110). In this case, when the receiving level accumulated value is smaller than the first reference level, the process operation is returned to the reception condition judging process operation of the step S101. On the other hand, in such a case that the receiving level accumulated value is larger than the first reference level, a process operation of an up/down counter is carried out by the up/down counter processing section-A 16a, and the AGC control section 16 judges whether or not a gain is stepped down from the present AGC gain (step S111).

FIG. 10 is a flow chart for describing a process sequence as to operations of the up/down counter processing section-A 16a. While the up/down counter processing section-A 16a has a function for executing counter processing operations of both an AGC gain down counter and an AGC gain up counter, the up/down counter processing section-A 16a outputs a down instruction of an AGC gain in response to counter values of these up and down counters. In the up/down processing section-A 16a, the counter value of the AGC gain up counter is cleared to become zero (step S201), and at the same time, the counter value of the AGC gain down counter is incremented (added) by +1 from the preceding counter value (step S202).

Then, the up/down counter processing section-A 16a judges whether or not the counter value of the AGC gain down counter is equal to or greater than a predetermined definition value (step S203). In this example, in such a case that a counter value of the AGG gain down counter is equal to or greater than a definition value "Mdn", namely, in such a case that a total number when the receiving level accumulated value exceeds the first reference level becomes equal to or greater than a definition number, the up/down counter processing section-A 16a outputs a down instruction (step S204). On the other hand, in such a case that a counter value of the AGC gain down counter is smaller than the definition value "Mdn", the up/down counter processing section-A 16a does not output the down instruction (step S205). In this example, the definition value "Mdn" is assumed as follows. That is, for instance, it is so assumed that Mdn=either 2 or 3. Since this up/down counter processing section-A 16*a* is operated in the above-described manner, the down instruction is outputted only in such a case that the receiving level accumulated value has continuously exceeded the first reference level at the AGC gain switching timing.

Returning back to FIG. 8, the AGC control section 16 judges whether or not the down instruction is outputted from the up/down counter processing section-A 6*a* after is executed the process operation of the step S111. In this example, when the down instruction is outputted from the up/down counter processing section-A 16*a*, the AGC control section 16 steps down the AGC gain of the AGC amplifying section 11 from the preceding AGC gain value by −3 (step S113). On the other hand, in such a case that the down instruction is not outputted, the AGC control section 16 maintains the present AGC gain based upon the preceding AGC gain value (step S107). Thereafter, the AGC control section 16 resets the receiving level accumulated value to zero of the initial value (step S108); the process operation is returned to the reception condition judging process operation of the step S101; and the AGC control section 16 restarts to accumulate receiving levels, and to judge whether or not an accumulated value exceeds the first reference level. As a consequence, in such a case that a total number when the receiving level accumulated value executes the first reference level becomes larger than the definition number at the division timing 1, the AGC gain is decreased by −3 steps. At this time, only in such a case that a level of an input signal to the A/D converting section 12 continuously is an excessively high level at the AGC gain switching timing based upon the above-explained operation with employment of the up/down counter processing section-A 16*a*, the AGC gain is changed. As a result, the adverse influence caused by a single mode variation of receiving levels can be hardly received.

Also, in the case that the present receiving level accumulation sampling timing is not equal to the division timing 1 in the step S109, the AGC control section 16 subsequently judges whether or not the present receiving level accumulation sampling timing is equal to the division timing 2 (step S114). In this example, when the present receiving level accumulation sampling timing corresponds to the division timing 2, the AGC control section 16 compares a receiving level accumulated value with the first reference level so as to judge whether or not the receiving level accumulated value is larger than the first reference level (step S115). In this case, when the receiving level accumulated value is smaller than the first reference level, the process operation is returned to the reception condition judging process operation of the step S101. On the other hand, in such a case that the receiving level accumulated value is larger than the first reference level, a process operation (shown in FIG. 10) of an up/down counter is carried out by the up/down counter processing section-A 16*a* in a similar manner to that of the step S111, and the AGC control section 16 judges whether or not a gain is stepped down from the present AGC gain (step S116).

Next, the AGC control section 16 judges whether or not the down instruction is outputted from the up/down counter processing section-A 16*a* (step S117). In this example, when the down instruction is outputted from the up/down counter processing section-A 16*a*, the AGC control section 16 steps down the AGC gain of the AGC amplifying section 11 from the preceding AGC gain value by −2 (step S118). On the other hand, in such a case that the down instruction is not outputted, the AGC control section 16 maintains the AGC gain based upon the preceding AGC gain value (step S107). Thereafter, the AGC control section 16 resets the receiving level accumulated value to zero of the initial value (step S108); the process operation is returned to the reception condition judging process operation of the step S101; and the AGC control section 16 restarts to accumulate receiving levels, and to judge whether or not an accumulated value exceeds the first reference level. As a consequence, in such a case that a total number when the receiving level accumulated value executes the first reference level becomes larger than the definition number at the division timing 2, the AGC gain is decreased by −2 steps.

Also, in the case that the present receiving level accumulation sampling timing is not equal to the division timing 2 in the step S114, the AGC control section 16 subsequently judges whether or not the present receiving level accumulation sampling timing is equal to the division timing 3 (step S119). In this example, when the present receiving level accumulation sampling timing corresponds to the division timing 3, the AGC control section 16 compares a receiving level accumulated value with the first reference level so as to judge whether or not the receiving level accumulated value is larger than the first reference level (step S120). In this case, when the receiving level accumulated value is smaller than the first reference level, the process operation is returned to the reception condition judging process operation of the step S101. On the other hand, in such a case that the receiving level accumulated value is larger than the first reference level, a process operation (shown in FIG. 10) of an up/down counter is carried out by the up/down counter processing section-A 16*a* in a similar manner to that of the step S111, and the AGC control section 16 judges whether or not a gain is stepped down from the present AGC gain (step S122).

Next, the AGC control section 16 judges whether or not the down instruction is outputted from the up/down counter processing section-A 16*a* (step S122). In this example, when the down instruction is outputted from the up/down counter processing section-A 166*a* the AGC control section 16 steps down the AGC gain of the AGC amplifying section 11 from the preceding AGC gain value by −1 (step S123). On the other hand, in such a case that the down instruction is not outputted, the AGC control section 16 maintains the present AGC gain based upon the preceding AGC gain value (step S107). Thereafter, the AGC control section 16 resets the receiving level accumulated value to zero of the initial value (step S108); the process operation is returned to the reception condition judging process operation of the step S101; and the AGC control section 16 restarts to accumulate receiving levels, and to judge whether or not an accumulated value exceeds the first reference level. As a consequence, in such a case that a total number when the receiving level accumulated value executes the first reference level becomes larger than the definition number at the division timing 3, the AGC gain is decreased by 1 steps.

Further, in such a case that the present receiving level accumulation sampling timing is not equal to the division timing 3 in the step S119, the AGC control section 16 subsequently judges whether or not the present receiving level accumulation sampling timing is equal to the division diving 4 (step S124). In this example, when the present receiving level accumulation sampling timing is not equal to the division timing 4, the process operation is returned to the reception condition judging process operation of the step S101. On the other hand, when the present receiving level accumulation sampling timing is equal to the division timing 4, the up/down counter processing section-B 16*b* executes a process operation of the up/down counter, and judges whether a gain is stepped down from the present AGC gain, or a gain is stepped up from the present AGC gain (step S125).

Figure 11:
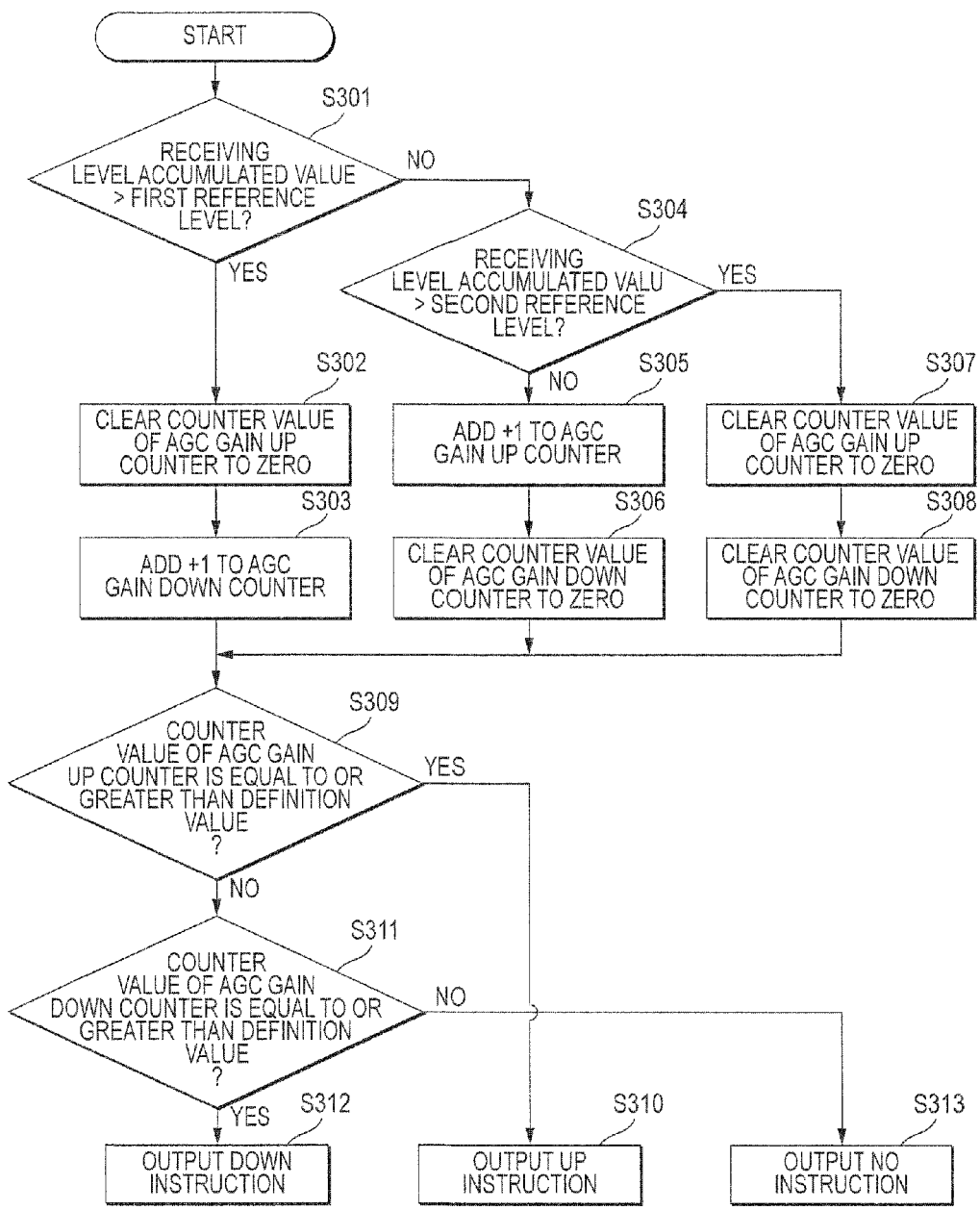
FIG. 11 is a flow chart for describing a process sequence as to operations of an up/down counter processing section-B in the embodiment.
Figure 12:
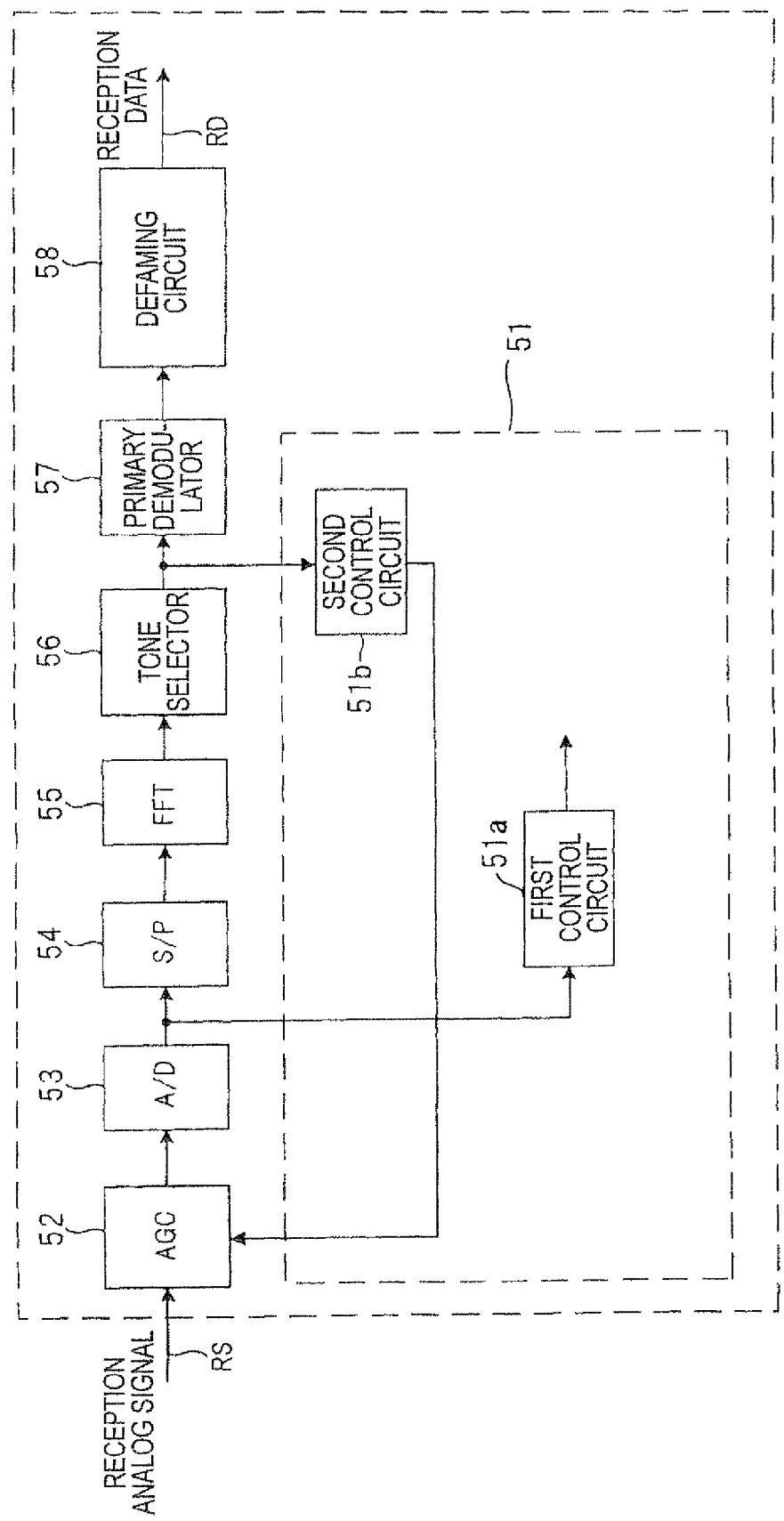
FIG. 12 is a block diagram for showing the structural example of the receiving circuit which contains the AGC circuit in the conventional communication apparatus

FIG. 11 is a flow chart for describing a process sequence as to operations of the up/down counter processing section-B 16b. While the up/down counter processing section-B 16b has a function for executing counter processing operations of both an AGC gain down counter and an AGC gain up counter. The up/down counter processing section-B 16b firstly compares a receiving level accumulated value with the first reference level so as to judge whether or not the receiving level accumulated value is larger than the first reference level at a predetermined division timing, for example, at the division timing 4 (step S301). In this example, when the receiving level accumulated value is larger than the first reference level (equivalent to situation (A) of FIG. 6), the counter value of the AGC gain up counter is cleared to zero (step S302), and at the same time, the counter value of the AGC gain down counter is incremented (added) by +1 from the preceding counter value (step S303).

Also, in such a case that the receiving level accumulated value is smaller than or equal to the first reference level in the step S301, subsequently, the up/down counter processing section-B 16b compares the receiving level accumulated value with the second reference level so as to judge whether or not the receiving level accumulated value is larger than the second reference level (step S304). In this case, when the receiving level accumulated value is smaller than or equal to the second reference level (equivalent to situation (C) of FIG. 6), the counter value of the AGC gain up counter is incremented (added) by +1 from the preceding counter value (step S305), and at the same time, the counter value of the AGC gain down counter is cleared to zero (step S306).

Also, in the case that the receiving level accumulated value is smaller than or equal to the first reference level, and further, is larger than the second reference level in the step S304 (equivalent to situation (B) of FIG. 6), the counter value of the AGC gain up counter is cleared to zero (step S307), and at the same time, the counter value of the AGC gain down counter is cleared to zero (step S308).

Then, the up/down counter processing section-B 16b judges whether or not the counter value of the AGC gain up counter is equal to or greater than a predetermined definition value "Mup" (step S309). In this example, in such a case that a counter value of the AGC gain up counter is equal to or greater than the definition value "Mup", namely, in such a case that a total number when the receiving level accumulated value is smaller than or equal to the second reference level becomes equal to or greater than a definition number, the up/down counter processing section-B 16b outputs an up instruction (step S310). In this example, the definition value "Mup" is assumed as follows: That is, for instance, it is so assumed that Mup=approximately 500.

On the other hand, in such a case that the counter value of the AGC gain up counter is smaller than the definition value "Mup", the up/down counter processing section-B 16b subsequently judges whether or to the counter value of the AGC gain down counter is equal to or greater than a predetermined definition value "Mdn" (step S311). In this example, in such a case that the counter value of the AGC gain down counter is equal to or greater than the definition value "Mdn", namely, in such a case that a total number when the receiving level accumulated value have exceeded the first reference level becomes equal to or greater than the definition number, the up/down counter processing section-B 16b outputs a down instruction (step S312). In this example, the definition value "Mdn" is assumed as follows: That is, for instance, it is so assumed that Mdn=either 2 or 3. On the other hand, when both the counter value of the AGC gain up counter and the counter value of the AGC gain down counter are smaller than the definition values, the up/down counter processing section-B 16b does not output both the down instruction and the up instruction (step S313). Since this up/down counter processing section-B 16b is operated in the above-described manner, only when the receiving level accumulated value continuously exceeds the first reference level at the division timing 4 (namely, timing of 1 symbol time period), the down instruction is outputted. Also, only when the receiving level accumulated value is lower than the second reference level for a long time period, the up instruction is outputted.

Returning back to FIG. 8, the AGC control section 16 judges whether or not a down instruction is outputted from the up/down counter processing section-B 11b after executes the process operation of the step S125 (step S126). In this step S126, when the down instruction is outputted from the up/down counter processing section-B 16b, the AGC control section 16 steps down the AGC gain of the AGC amplifying section 11 from the preceding AGC gain value by −1 (step S123). Thereafter, the AGC control section 16 resets the receiving level accumulated value to zero of the initial value (step S108); the process operation is returned to the reception condition judging process operation of the step S101: and the AGC control section 16 restarts to accumulate receiving levels, and to judge whether or not an accumulated value exceeds the first reference level. As a consequence, in such a case that a total number when the receiving level accumulated value has executed the first reference level becomes larger than the definition time at the division timing 4, the AGC gain is decreased by −1 step.

When the down instruction has not be outputted at the step S126, the AGC control section 16 subsequently judges whether or not an up instruction is outputted from the up/down counter processing section-B 16b (step S127). In this step S127, in such a case that the up instruction is outputted, the AGC control section 16 steps up the AGC gain of the AGC amplifying section 11 from the preceding AGC gain value by +1 (step S128). Thereafter, the AGC control section 16 resets the receiving level accumulated value to zero of the initial value (step S108); the process operation is returned to the reception condition judging process operation of the step S101; and the AGC control section 16 restarts to accumulate receiving levels, and to judge whether or not an accumulated value exceeds the first reference level. As a consequence, in such a case that a total number when the receiving level accumulated value is lower than the second reference level becomes smaller than the definition number at the division timing 4, the AGC gain is increased by +1 step.

On the other hand, in such a case that the down instruction is not outputted in the step S126 and the up instruction is not outputted in the step S127, the AGC control section 16 maintains the AGC gain based upon the preceding AGC gain value (step S107). Thereafter, the AGC control section 16 resets the receiving level accumulated value to zero of the initial value (step S108); the process operation is returned to the reception condition judging process operation of the step S101; and the AGC control section 16 restarts to accumulate receiving levels, and to judge whether or not an accumulated value exceeds the first reference level. At this time, only in such a case that an input to the A/D converting section 12 continuously is an excessively high level at the AGC gain switching timing based upon the above-explained operation with employment of the up/down counter processing section, otherwise, only when the input to the A/D converting section 12 is under very low level condition for a long time, the AGC gain is changed. As a result, the adverse influence caused by a single mode variation of receiving levels can be hardly received.

Due to the above-explained process operations executed by the up/down counter processing section-A 16*a* and the up/down counter processing section-B 16*b*, the resistibility with respect to the noise appeared on the transmission path can be improved. For instance, in such a case that the power line communication apparatus receives signals to which impulsatory noises and periodical noises are superimposed, while these impulsatory noises and periodical noises are such noise patterns generated from household electric appliances within homes, or the power line communication apparatus receives signals under such an environmental condition that periodical amplitude vibrations are produced due to impedance variations of household electric appliances, even when a receiving level accumulated value becomes higher than the first reference level due to the above-described noises at certain AGC gain switching timing, the AGC gain is not varied unless the receiving level accumulated value continuously exceeds the first reference level. As a result, the AGC circuit can have the resistibility with respect to the impulsatory noises and the periodical noises.

Also, while the power line communication apparatus is under receiving operation (under non-transmitting operation) in a non-signal status, even if the AGC gain is stepped down in conjunction with either the periodic noises or the amplitude variation, there is such a technical idea that since the receiving level is lower than the second reference level under the normal operation when no signal is received and this low receiving level situation can be easily detected in the continuous manner, the AGC gain may be finally returned to the maximum gain. As a consequence, even when the noises appeared on the transmission line contain the periodical factor, the attenuated transmission signals can also be received.

As previously described, in this embodiment, the AGC control section 16 controls the AGC gain of the AGC amplifying section 11 in such a manner that the signal receiving level becomes the maximum receiving level when the signal reception is commenced; after the signal reception is commenced, the AGC control section 16 compares the predetermined threshold value with such a receiving level accumulated value which is obtained by accumulating the reception signal levels in the receiving level detecting section 15; when the receiving level accumulated value exceeds the threshold value, the AGC control section 16 decreases the AGC gain value of the AGC amplifying section 11; and when the receiving level accumulated value does not exceed the threshold value, the AGC control section 16 maintains the present AGC gain value of the AGC amplifying section 11. At this time, the AGC control section 16 performs the judging operations of the receiving levels within such a short time interval produced by diving 1 symbol period of a reception signal by the plural number, and controls the AGC amplifying section 11 in such a manner that the AGC gain is reduced at such a timing when the receiving level accumulated value exceeds the threshold value.

As a consequence, in accordance with present invention, the AGC operation is carried out based upon such a simple control operation that the AGC gain is basically increased/decreased, and the reception signals acquired within the short time period are accumulated so as to be evaluated, so that the AGC control operation can be realized, while the AGC gain can be changed at more quickly timing in response to the excessive degrees of the receiving levels. As a result, the AGC gain of the AGC amplifying section 11 can be set to the optimum gain value within the short time, so that the AGC control section having the high sensitivity can be realized in the conventional technique, the receiving level detected in the unit of 1 symbol was judged so as to change the AGC gain. In contrast thereto, in this embodiment, the receiving level accumulated value can be judged in such a short time interval obtained by sub-dividing 1 symbol period by the plural number so as to change the AGC gain, so that the AGC operation can be carried out in the high speed.

Moreover, the adjusting amount of the AGC gain is changed in response to such a time period during which the receiving level accumulated value exceeds the threshold value, and when the receiving level accumulated value exceeds the threshold value within the short time, the AGC gain is largely decreased. Accordingly, the excessive degree of the input signal can be previously predicted based upon the situation of the receiving level accumulated value so as to properly determine the reducing lever of the AGC gain. As a result, the AGC gains can be converged within the short time until the proper AGC gain value is obtained even with respect to the excessively large input signals.

Also, in order that the AGC gain is changed, in such a case that a total number when the receiving level accumulated values continuously exceed the threshold value becomes equal to or greater than the definition time, the AGC gain is changed. As a result, it is possible to suppress that the AGC gain may be unnecessarily changed with respect to the impulsatory noises and the periodical noises, so that the noise resistibility can be improved.

As a consequence, in accordance with this embodiment, the detecting speed for detecting the carrier in the demodulating section 13 can be improved (namely, AGC locking operation can be performed in high speed), and the AGC gain can be controlled in the high speed, so that the AGC gain can be converged in the high speed. As a consequence, the AGC control section having such high performance (namely, high sensitivity and high-speed operation) can be realized, and therefore, both a receiving level control apparatus having this AGC control section and a communication apparatus containing a receiver having a high receiving sensitivity and equipped with this receiving level control apparatus can be provided. More specifically, the inventive idea of the present invention may be suitably applied to a receiver for a multi-carrier communication type communication apparatus such as a power line communication apparatus. That is, while the multi-carrier communication type communication apparatus employs such a demodulation system that a plurality of carriers are multiplexed and multiple values are modulated in 1 symbol, reductions in processing times related to AGC feedback control operation are required in order to stabilize reception signals modulated in the above-described manner in the power line communication apparatus.

It should be understood that the present invention is not limited only to the inventive ideas described in the above-explained embodiment, but may be modified and changed based upon descriptions of the present specification and technical ideas well known in the field by ordinarily skilled engineers, which may apparently cover the technical scope of the protections according to the present invention.

The present invention has such an advantage that a receiving level control operation can be realized by a simple arrangement without using a complex process operation, and a high-speed AGC operation with a high sensitivity can be carried out. Thus, the present invention can be useful as a receiving level control apparatus capable of controlling a receiving level of a signal, in such a receiving level control apparatus employed in a receiving circuit of a communication apparatus for performing a communication operation using a power line, and also, in a receiver equipped with the receiving level control apparatus.

The present application is based on Japanese Patent Application No. 2008-034493 filed on Feb. 15, 2008, the contents of which are incorporated herein for reference.

What is claimed is:

1. A receiving level control apparatus, comprising:
an amplifier configured to receive a signal and to amplify the signal based on a gain control signal;
a memory configured to store an accumulated level of the amplified signal at every sampling period; and
a gain control section configured to judge whether or not the accumulated level, which has been accumulated from a first time instant, exceeds a first reference value at a predetermined timing, and to control the gain control signal for the amplifier in response to a length of a time period defined from the first time instant up to a second time instant in a case that the accumulated level exceeds the first reference value, the second time instant defined as a time instant when the gain control section judges that the accumulated level exceeds the first reference value,
wherein the gain control section counts a total number of situations that the accumulated level exceeds the first reference value in judgments of the accumulated level; and
wherein when the total number becomes equal to or greater than a predetermined number, the gain control section changes the gain control signal for the amplifier.

2. The receiving level control apparatus according to claim 1, wherein the signal received by the amplifier is a modulation signal constructed of multi-carriers; and
wherein the gain control section judges whether or not the accumulated level exceeds the first reference value at the predetermined timing defined as a sub-divided timing produced by sub-dividing one symbol period in a modulation scheme of the modulation signal.

3. The receiving level control apparatus according to claim 1, wherein when the accumulated level exceeds the first reference value, the gain control section decreases the gain control signal for the amplifier, and returns the accumulated level to an initial value thereof to restart an accumulation of the signal levels and a judgment of the accumulated level.

4. The receiving level control apparatus according to claim 1, wherein the gain control section changes the gain control signal with an adjusting amount proportional to the length of the time period defined from the first time instant up to the second time instant.

5. The receiving level control apparatus according to claim 1, wherein when the accumulated level does not exceed a second reference value which is smaller than the first reference value at the predetermined timing, the gain control section increases the gain of the amplifier, and returns the accumulated level to an initial value thereof to restart the accumulation of the signal levels and the judgment of the accumulated level.

6. A receiver comprising the receiving level control apparatus according to claim 1.

7. The receiving level control apparatus according to claim 1, wherein the gain control section sets the gain of the amplifier to a maximum gain at an initial condition.

8. A receiving level control apparatus, comprising:
an amplifier configured to receive a signal and to amplify the signal based on a gain control signal;
a memory configured to store an accumulated level of the amplified signal at every sampling period; and
a gain control section configured to judge whether or not the accumulated level, which has been accumulated from a first time instant, exceeds a first reference value at a predetermined timing, and to control the gain control signal for the amplifier in response to a length of a time period defined from the first time instant up to a second time instant in a case that the accumulated level exceeds the first reference value, the second time instant defined as a time instant when the gain control section judges that the accumulated level exceeds the first reference value,
wherein the gain control section counts a total number of situations that the accumulated level does not exceed a second reference value, which is smaller than the first reference value, in judgments of the accumulated level, and
wherein when the total number becomes equal to or greater than a predetermined number, the gain control section changes the gain control signal for the amplifier.

* * * * *